United States Patent
Vino, IV et al.

(10) Patent No.: US 9,356,367 B2
(45) Date of Patent: May 31, 2016

(54) ELECTRICAL CONNECTOR HAVING COMPLIANT CONTACTS AND A CIRCUIT BOARD ASSEMBLY INCLUDING THE SAME

(71) Applicant: Tyco Electronics Corporation, Berwyn, PA (US)

(72) Inventors: Michael Joseph Vino, IV, Landisville, PA (US); Craig Warren Hornung, Harrisburg, PA (US); John Joseph Consoli, Harrisburg, PA (US); Chad William Morgan, Carneys Point, NJ (US)

(73) Assignee: Tyco Electronics Corporation, Berwyn, PA (US)

( * ) Notice: Subject to any disclaimer, the term of this patent is extended or adjusted under 35 U.S.C. 154(b) by 148 days.

(21) Appl. No.: 14/150,094

(22) Filed: Jan. 8, 2014

(65) Prior Publication Data
US 2015/0194752 A1   Jul. 9, 2015

(51) Int. Cl.
*H05K 1/00* (2006.01)
*H01R 12/58* (2011.01)
*H05K 1/18* (2006.01)
*H01R 43/16* (2006.01)
*H01R 12/73* (2011.01)

(52) U.S. Cl.
CPC .............. *H01R 12/585* (2013.01); *H01R 43/16* (2013.01); *H05K 1/184* (2013.01); *H01R 12/737* (2013.01); *Y10T 29/49204* (2015.01)

(58) Field of Classification Search
CPC ..... H01R 112/585; H01R 43/16; H05K 1/184
USPC ............ 439/65, 66, 72, 73, 81, 82, 404, 405, 439/591, 751, 943, 660
See application file for complete search history.

(56) References Cited

U.S. PATENT DOCUMENTS

| | | | | |
|---|---|---|---|---|
| 4,526,429 A | * | 7/1985 | Kirkman | H01R 12/58 439/751 |
| 4,676,579 A | | 6/1987 | Ting | |
| 4,906,209 A | | 3/1990 | Tanabe et al. | |
| 5,944,538 A | | 8/1999 | Sorig | |
| 6,213,817 B1 | | 4/2001 | Jeong et al. | |
| 6,286,209 B1 | | 9/2001 | Mitra et al. | |
| 7,008,272 B2 | * | 3/2006 | Blossfeld | H01R 12/585 439/751 |

(Continued)

FOREIGN PATENT DOCUMENTS

| | | |
|---|---|---|
| EP | 0088018 A1 | 9/1983 |
| EP | 0225400 A1 | 6/1987 |

(Continued)

OTHER PUBLICATIONS

International Search Report, International Application No. PCT/US2014/072097, International Filing Date, Dec. 23, 2014.

*Primary Examiner* — Hoa C Nguyen

(57) ABSTRACT

Electrical connector having a plurality of compliant contacts coupled to a connector body. Each of the compliant contacts includes a base portion and first and second legs extending from the base portion to respective distal ends in a mounting direction. Each of the first and second legs includes an inner edge and an outer edge. Each of the inner edges extends from the base portion to a corresponding inflection area. A gap between the first and second legs decreases as the inner edges approach the corresponding inflection areas in the mounting direction. The inflection areas of the inner edges directly interface with each other at a contact zone.

20 Claims, 6 Drawing Sheets

(56) References Cited

U.S. PATENT DOCUMENTS

| | | |
|---|---|---|
| 7,549,897 B2 | 6/2009 | Fedder et al. |
| 7,828,561 B2 | 11/2010 | Gueckel |
| 7,883,366 B2 * | 2/2011 | Davis .................. H01R 23/688 439/607.01 |
| 7,891,992 B2 * | 2/2011 | Veigel ................... H01R 9/091 439/82 |
| 8,123,572 B2 | 2/2012 | Sharf et al. |
| 2005/0239345 A1 | 10/2005 | Furuno et al. |
| 2007/0212907 A1 * | 9/2007 | Kramski .............. H01R 12/585 439/82 |
| 2007/0218778 A1 | 9/2007 | Lappoehn |
| 2011/0159743 A1 | 6/2011 | Johnescu et al. |
| 2013/0090025 A1 | 4/2013 | Trout et al. |

FOREIGN PATENT DOCUMENTS

| | | |
|---|---|---|
| EP | 0488487 A1 | 6/1992 |
| EP | 2105995 A1 | 9/2009 |

* cited by examiner

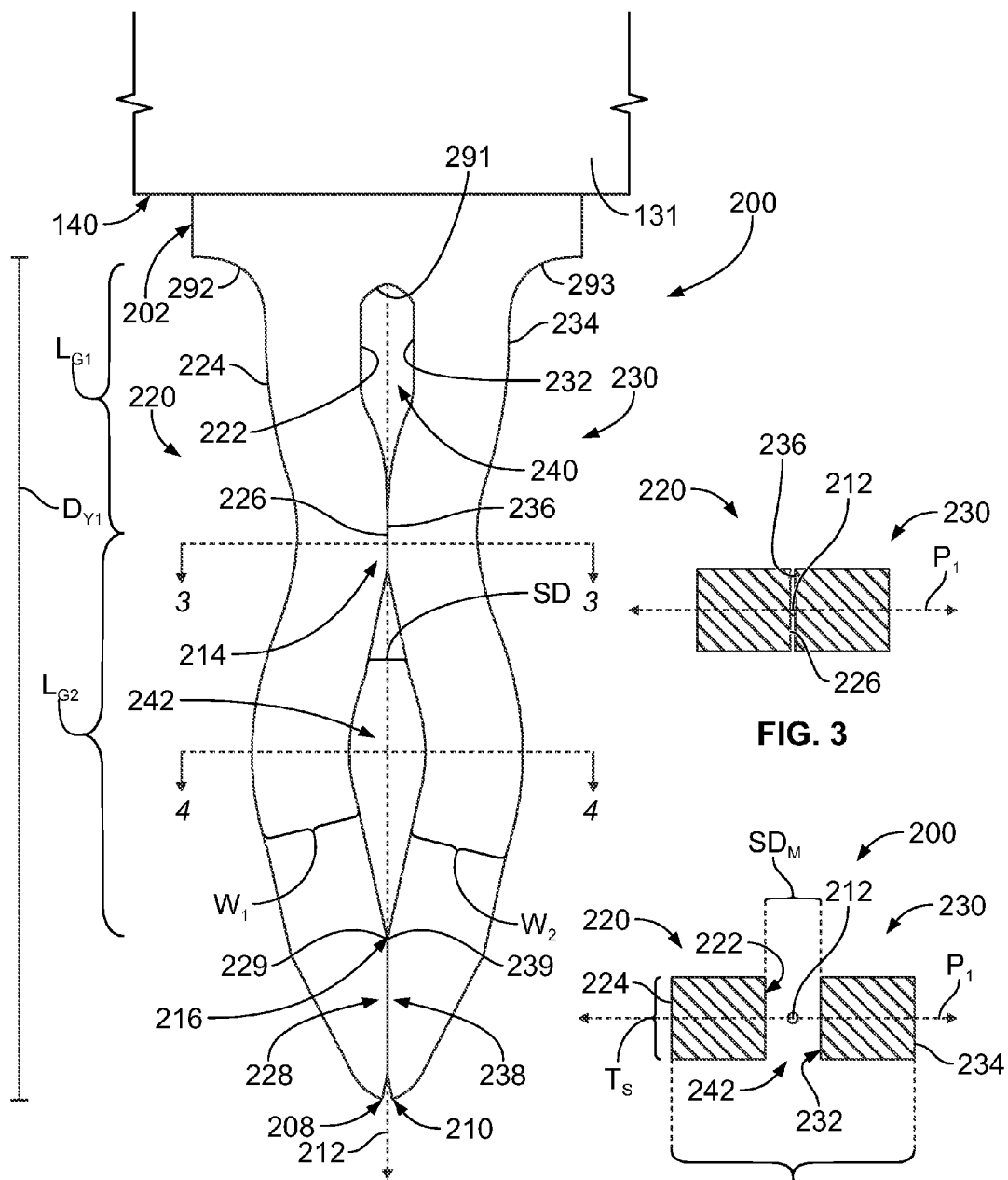

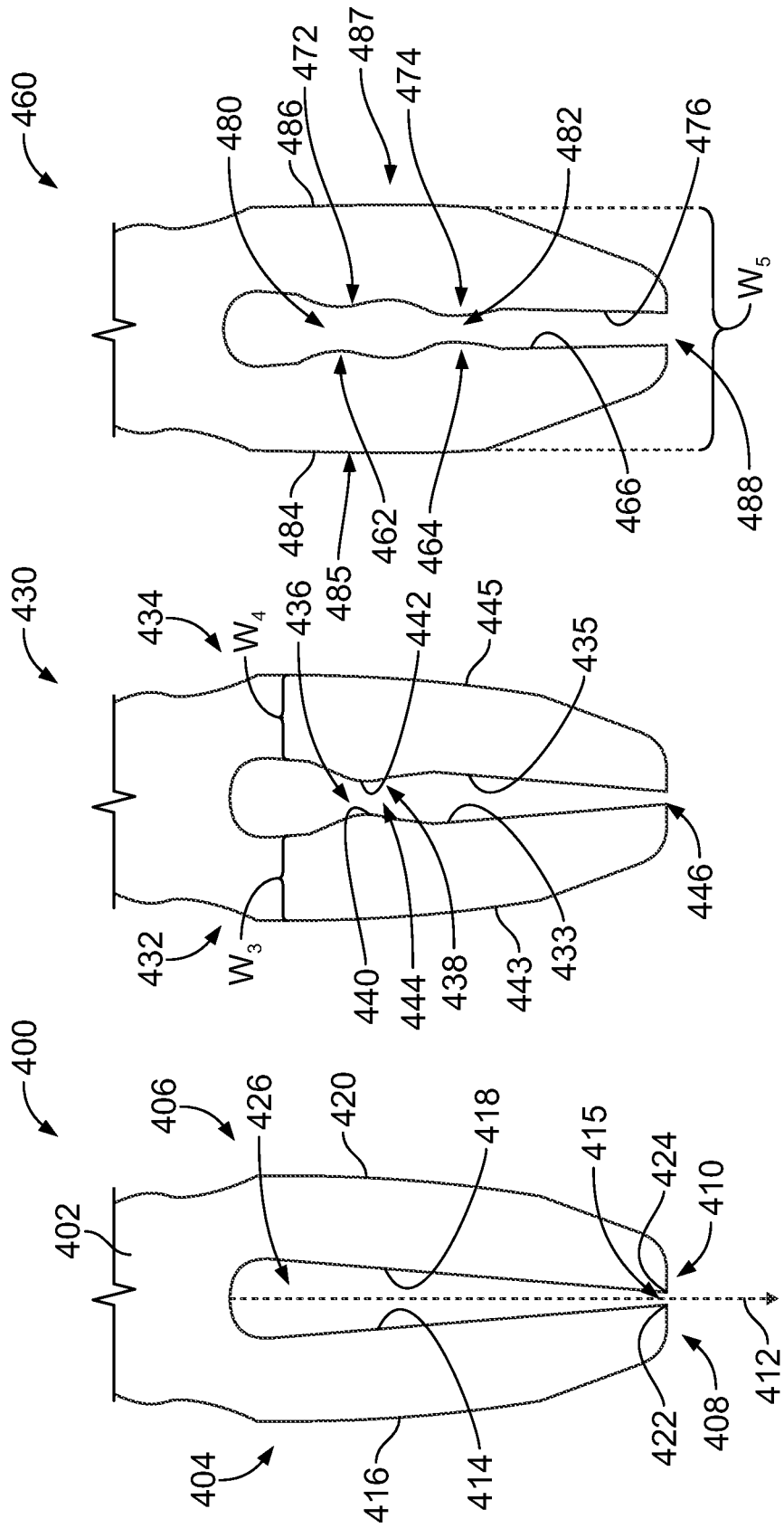

ELECTRICAL CONNECTOR HAVING COMPLIANT CONTACTS AND A CIRCUIT BOARD ASSEMBLY INCLUDING THE SAME

BACKGROUND

The subject matter herein relates generally to compliant contacts and an electrical connector including the same that are configured to engage an electrical component, such as a circuit board.

Electrical connectors may be interconnected to circuit boards using compliant or press-fit contacts that form a mechanical and electrical coupling with the circuit board. For this purpose, the circuit boards include a plurality of thru-holes extending through a thickness of the circuit board. The thru-holes are typically "plated" to form plated thru-holes (PTHs) by covering inner surfaces that define the thru-holes with a conductive material, such as copper. Traces or other conductive elements that are connected to the conductive material of the PTHs form electrical pathways from the corresponding PTH to another portion of the circuit board.

To interconnect the circuit board and the electrical connector, the compliant contacts from the electrical connector are inserted into corresponding PTHs. Each compliant contact frictionally engages the conductive material within the PTH. For example, eye-of-needle (EON) contacts include a narrow beam of sheet metal that has a hole stamped therethrough. Outer edges of the EON contact have convex profiles proximate to the hole such that the outer edges arch or bow outwardly. A maximum diameter between the outer edges is slightly larger than a diameter of the PTH. When the EON contact is inserted into the PTH, the outer edges proximate to the hole engage the conductive material of the PTH.

However, conventional compliant contacts typically have a length that is more than sufficient for contacting an interior surface of the PTH. For example, manufacturers often desire for the compliant contacts to engage the PTH at a depth that is proximate to a first signal layer in the circuit board. After engaging the PTH at a first depth, the conventional compliant contacts generally continue to extend to a second depth. This additional length between the first and second depths (hereinafter referred to as a stub portion of the compliant contact) may cause unwanted noise with the surrounding PTH. To reduce the noise, the PTHs may be backdrilled to remove at least some of the plated conductive material that extends beyond the first depth. Backdrilling, however, can increase the cost of the circuit board.

In addition to the above, conventional compliant contacts are typically manufactured in a manner that is consistent with certain standards. For example, it is difficult to manufacture EON contacts in which the hole of the EON contact has a width that is less than a thickness of the stock material that forms the EON contact. As such, the ratio between the hole width and the stock thickness is typically 1.0 to 1.0. For certain configurations of a compliant contact, the ratio may be, at the very least, 0.85 to 1.0. Ratios less than this are typically not commercially reasonable, because the stock material is difficult to shape during manufacturing.

Accordingly, there is a need for a compliant contact that is capable of mechanically and electrically coupling to PTHs while having smaller dimensions than conventional compliant contacts.

BRIEF DESCRIPTION

In an embodiment, an electrical connector for being mounted to a circuit board having plated thru-holes (PTHs) is provided. The electrical connector includes a connector body having a mounting side that is configured to be mounted to the circuit board and a plurality of compliant contacts coupled to the mounting side and configured to be inserted into corresponding PTHs of the circuit board. Each of the compliant contacts includes a base portion coupled to the mounting side of the electrical connector and first and second legs extending in a mounting direction from the base portion to respective distal ends. The distal ends are physically discrete. Each of the first and second legs includes an inner edge and an outer edge. The outer edges are configured to engage the corresponding PTH. Each of the inner edges extends from the base portion to a corresponding inflection area. A gap between the first and second legs decreases as the inner edges approach the corresponding inflection areas in the mounting direction. The inflection areas of the inner edges directly interface with each other at a contact zone.

In an embodiment, a circuit board assembly is provided that includes a circuit board having plated thru-holes (PTHs) that extend therethrough. The PTHs are defined by respective interior surfaces of the circuit board. The circuit board assembly also includes an electrical connector having a mounting side that is coupled to the circuit board and a plurality of compliant contacts that project form the mounting side. Each of the compliant contacts of the plurality is inserted into one of the PTHs. Each of the compliant contacts includes a base portion coupled to the mounting side of the electrical connector and first and second legs that extend from the base portion to respective distal ends. The distal ends are physically discrete. Each of the first and second legs includes an inner edge and an outer edge. The outer edges of the first and second legs are engaged to the interior surface of the corresponding PTH, and the inner edges of the first and second legs engage each other at a contact zone. A gap exists between the inner edges of the first and second legs and between the base portion and the contact zone.

In an embodiment, a method of manufacturing compliant contacts is provided. The method includes providing a sheet of conductive material and stamping a plurality of contact bodies from the sheet of the conductive material. Each of the contact bodies includes a base portion and first and second legs extending from the base portion to respective distal ends. The first and second legs have corresponding inner edges that face each other and are spaced apart. The method also includes permanently deforming the first and second legs such that the corresponding inner edges engage each other at a contact zone, wherein a gap that is defined between the inner edges exists between the base portion and the contact zone.

BRIEF DESCRIPTION OF THE DRAWINGS

FIG. 2 is a plan view of a compliant contact in accordance with an embodiment that may be used to engage plated thru-holes (PTHs) of a circuit board.

FIG. 3 is a cross-section of the compliant contact taken along the line 3-3 of FIG. 2 through a contact zone.

FIG. 4 is a cross-section of the compliant contact taken along the line 4-4 of FIG. 2 including a gap formed by the compliant contact.

FIG. 10 is a plan view of a compliant contact formed in accordance with an embodiment.

FIG. 11 is a plan view of a compliant contact formed in accordance with an embodiment.

FIG. 12 is a plan view of a compliant contact formed in accordance with an embodiment.

DETAILED DESCRIPTION

Figure 1:
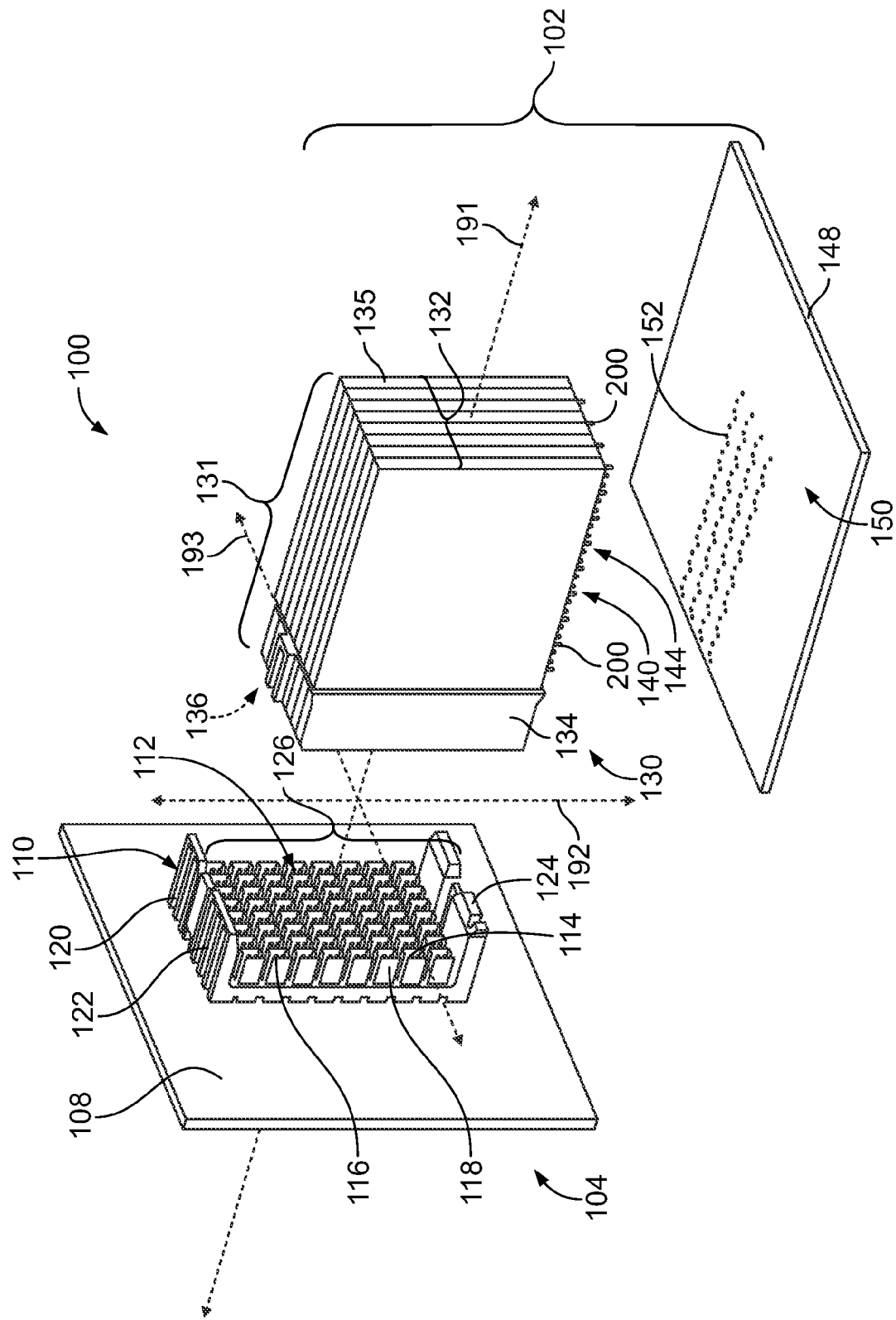
FIG. 1 is a perspective view of a communication system that includes first and second circuit board assemblies formed in accordance with an embodiment.

FIG. 1 illustrates an exploded perspective view of a communication system 100 that includes a first circuit board assembly 102 and a second circuit board assembly 104. For reference, the circuit board assemblies 102, 104 are arranged with respect to mutually perpendicular axes 191, 192, 193, including a central mating axis 191, a mounting axis 192, and a lateral axis 193. During a mating operation, the circuit board assembly 102 is advanced along the mating axis 191 toward the circuit board assembly 104. In the illustrated embodiment, the circuit board assembly 104 is a backplane assembly, and the circuit board assembly 102 is a daughter card assembly configured to directly engage the backplane assembly. Embodiments set forth herein, however, are not limited to backplane (or midplane) applications.

The circuit board assembly 104 includes a circuit board 108 and an electrical connector 110 mounted to the circuit board 108. The circuit board 108 may be, for example, a motherboard. The electrical connector 110 may be referred to as a mating connector or header connector. The electrical connector 110 has a contact array (or header array) 112 of electrical contacts that include signal contacts 114 and ground contacts 116. In FIG. 1, the signal contacts 114 are arranged in pairs in which each signal pair is partially surrounded by a respective ground contact 116. The signal contacts 114 are configured to transmit data signals, such as differential signals, and the ground contacts 116 are configured to electrically shield the signal contacts 114. For example, each of the ground contacts 116 may be C-shaped or L-shaped and partially surround a single pair of the signal contacts 114. In the illustrated embodiment, the contact array 112 also includes ground shields or walls 118. The ground shields 118 are arranged along an outer column of the contact array 112 and may also be configured to electrically shield corresponding signal contacts 114.

The electrical connector 110 also includes a connector housing 120. As shown, the connector housing 120 includes a pair of sidewalls 122, 124 that define a connector-receiving space 126 therebetween. The sidewalls 122, 124 oppose each other and are spaced apart from each other along the mounting axis 192. The contact array 112 is located within the connector-receiving space 126. The connector housing 120 may have other configurations in alternative embodiments. For example, in one alternative embodiment, the connector housing 120 may include another pair of sidewalls that are spaced apart from each other along the lateral axis 193.

The circuit board assembly 102 includes an electrical connector 130, which may also be referred to as a receptacle connector. In some embodiments, the electrical connector 130 includes a module assembly 132 and a connector shroud or housing 134 that is coupled to the module assembly 132. For example, the module assembly 132 includes a series of discrete or distinct contact modules 135 that are stacked side-by-side when the module assembly 132 is assembled. The contact modules 135 may be coupled to one another directly or indirectly. For example, the contact modules 135 may be coupled to the connector shroud 134 such that the contact modules 135 are indirectly coupled to one another by the connector shroud 134. In other embodiments, the contact modules 135 may directly engage each other to hold the contact modules 135 side-by-side.

In some embodiments, the module assembly 132 and the connector shroud 134 may be referred to collectively as a connector body 131 of the electrical connector 130. As shown, the connector body 131 includes separable components, such as the connector shroud 134 and the module assembly 132. However, in other embodiments, one or more components may be combined. For instance, the module assembly 132 may include features that are similar to the features of the connector shroud 134 as described herein. In such embodiments, a separate connector shroud may not be required. As another example, in the illustrated embodiment, the module assembly 132 includes discrete contact modules 135. In other embodiments, however, the module assembly may be a single structure that includes similar features as the multiple contact modules described herein.

The connector shroud 134 is configured to be inserted into the connector-receiving space 126 and mate with the connector housing 120. The electrical connector 130 includes a mating side 136 and a mounting side 140. The mating side 136 may include a portion of the connector shroud 134 that faces the electrical connector 110 along the mating axis 191. In alternative embodiments that do not utilize a connector shroud, the module assembly 132 may include the mating side 136. The mounting side 140 faces in a mounting direction along the mounting axis 192.

Each of the mating side 136 and the mounting side 140 has a corresponding contact array that includes signal contacts and ground contacts disposed along the corresponding side of the connector body 131. For example, the mating side 136 includes a communication array (not shown) of signal and ground contacts that engage the contact array 112. The mounting side 140 includes a mounting array 144, which may have respective signal contacts and ground contacts, which are generally referred to hereafter as compliant contacts 200.

The circuit board assembly 102 also includes a circuit board or daughter card 148. The circuit board 148 is configured to interface with the mounting side 140. More specifically, the circuit board 148 includes a board array 150 of plated thru-holes (PTHs) 152. The PTHs 152 are arranged to receive respective compliant contacts 200 of the mounting array 144. As used herein, a "plated thru hole" (or PTH) is not required to extend entirely through the circuit board 148 or be manufactured in a particular manner.

FIG. 2 is a plan view of the compliant contact 200 coupled to the mounting side 140 of the connector body 131. As described in greater detail below, the compliant contact 200 may be stamped and formed from a sheet of conductive material, such as sheet metal, to include the features described herein. However, the compliant contact 200 is not required to be manufactured using a particular process or processes. The compliant contact 200 as shown in FIG. 2 represents the compliant contact 200 in an operative condition in which the compliant contact 200 is ready for insertion into one of the corresponding PTHs 152 (FIG. 1).

In some embodiments, the compliant contact 200 is configured to operate as a signal contact or as a ground contact for the electrical connector 130 (FIG. 1). It is understood, however, that the compliant contact 200 is not limited to backplane applications and may be used to engage a PTH or a PTH-like interface of other electrical components. In other embodiments, the compliant contact 200 may operate as a power contact for transmitting electrical power.

In the illustrated embodiment, the compliant contact 200 includes a base portion 202 and first and second legs 220, 230 that are coupled to the base portion 202 and extend in a mounting direction $M_1$ from the base portion 202 to respective distal ends 208, 210. The mounting direction $M_1$ is away from the mounting side 140. The compliant contact 200 is oriented with respect to a longitudinal axis 212 that extends from a center of the base portion 202 and generally parallel to and between the first and second legs 220, 230. At different points along the longitudinal axis 212, the longitudinal axis 212 may be equi-spaced between the first and second legs 220, 230. For example, with respect to FIG. 2, the first and second legs 220, 230 may be symmetrical relative to a plane that extends through the longitudinal axis 212 and bisects the compliant contact 200. Also shown, the first and second legs 220, 230 extend a common depth $D_{Y1}$ that is measured from the base portion 202 to the distal ends 208, 210 or along the longitudinal axis 212. In other embodiments, the first and second legs 220, 230 do not extend the same depth $D_{Y1}$. In certain embodiments, the depth $D_{Y1}$ is at most 1.50 mm or, more specifically, at most 1.20 mm. In more particular embodiments, the depth $D_{Y1}$ may be less than 1.00 mm.

The first and second legs 220, 230 may directly interface with each other at a first contact zone 214 and a second contact zone 216. When used to describe the relationship between two elements, the term "directly interface" includes the two elements directly engaging each other, having a nominal gap therebetween, or being positioned to directly face each other with a small distance therebetween. For example, small spaces may exist between the first and second legs 220, 230 at the contact zones 214, 216 when the first and second legs 220, 230 directly interface each other. A "contact zone," as used herein, represents a region where the first and second legs 220, 230 are configured to engage each other when the compliant contact 200 is within the PTH 152.

The first and second legs 220, 230 are physically discrete elements that are only coupled to each other through the base portion 202. Unlike an eye-of-needle (EON) contact, which includes separate beam portions that are joined to each other at each end, the first and second legs 220, 230 are distinct elements. More specifically, the first and second legs 220, 230 are distinct elements from the base portion 202 to the respective distal ends 208, 210 and including the distal ends 208, 210. Unlike the EON contacts, the first and second legs 220, 230 from the base portion 202 to the respective distal ends 208, 210 are not joined by being part of a continuous piece of material of the compliant contact 200. For instance, even if the distal ends 208, 210 physically engage each other, the distal ends 208, 210 may be readily separable when not located within the PTH 152. Thus, the distal ends 208, 210 may be characterized as being physically discrete even if the distal ends 208, 210 engage each other.

The first leg 220 has an inner edge 222 and an outer edge 224 that face in generally opposite directions. It is understood that the inner and outer edges 222, 224 may be part of a single continuous edge that extends from the base portion 202 to the distal end 208 along the inner edge 222 and then back to the base portion 202 along the outer edge 224. The outer edge 224 represents a portion of the continuous edge that generally faces or directly engages an interior surface 262 (shown in FIG. 5) of the PTH 152. Each of the inner and outer edges 222, 224 extends from the base portion 202 to the distal end 208. More specifically, the inner edge 222 extends from a bridge edge 291 that joins the first and second legs 220, 230 to the distal end 208. The outer edge 224 extends from an outer base edge 292 to the distal end 208. The inner edge 222 represents a portion of the continuous edge that generally faces or engages the other second leg 230. The inner and outer edges 222, 224 define a width $W_1$ of the first leg 220. As shown, the width $W_1$ of the first leg 220 may be substantially uniform for almost an entire length of the first leg 220. In other embodiments, such as those shown in FIGS. 9-11, the width $W_1$ of the compliant contact 200 may not be uniform.

Figure 5:
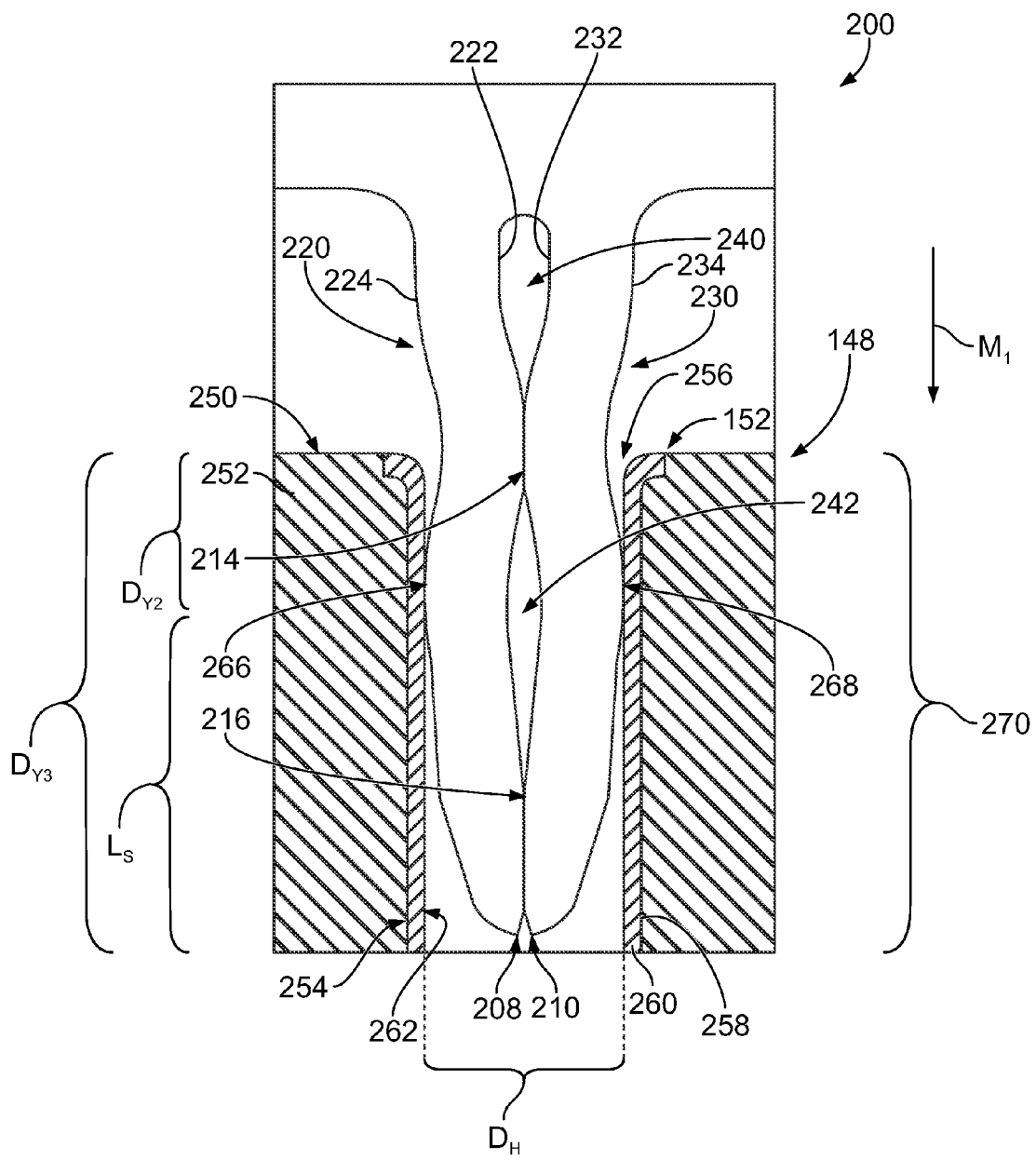
FIG. 5 shows the compliant contact of FIG. 2 inserted into a corresponding PTH in accordance with an embodiment.

Similarly, the second leg 230 has an inner edge 232 and an outer edge 234 that face in generally opposite directions. Again, it is understood that the inner and outer edges 232, 234 may be part of a single continuous edge. Each of the inner and outer edges 232, 234 extends from the base portion 202 to the distal end 210. More specifically, the inner edge 232 extends from a bridge edge 291 to the distal end 210, and the outer edge 234 extends from an outer base edge 293 to the distal end 210. The outer edge 234 is configured to engage the interior surface 262 (FIG. 5). The inner and outer edges 232, 234 define a width $W_2$ of the second leg 230. As shown, the width $W_2$ of the second leg 230 may be substantially uniform for almost an entire length of the second leg 230 and may be substantially equal to the width $W_1$.

The first and second legs 220, 230 and/or the inner edges 222, 232 have non-linear profiles that form first and second gaps 240, 242. The non-linear profiles may be wave-like or serpentine. In other embodiments, however, the first and second legs 220, 230 and/or the inner edges 222, 232 may be substantially linear. The inner edges 222, 232 face each other and have a separation distance SD therebetween. The separation distance SD may be zero at the contact zones 214, 216.

In the illustrated embodiment, as the inner edges 222, 232 extend away from the mounting side 140, the inner edges 222, 232 extend from the base portion 202 to respective inflection areas 226, 236 and then to respective inflection areas 228, 238. As used herein, an "inflection area" of a leg represents a localized area of an inner edge that is closer to the longitudinal axis than other areas of the inner edge that immediately precede or, in some cases, immediately follow the inflection area. The inflection area may be similar to a point of inflection on a graph. For example, as the inner edges 222, 232 approach the inflection area 226, 236, respectively, each of the inner edges 222, 232 extends toward and becomes closer to the longitudinal axis 212. The first gap 240 is defined longitudinally between the base portion 202 and the first contact zone 214 and laterally between the inner edges 222, 232. The first gap 240 decreases as the inner edges 222, 232 approach the inflection areas 226, 236, respectively.

As another example, the inner edges 222, 232 extend away from the longitudinal axis 212 as the inner edges 222, 232 extend from the inflection areas 226, 236, respectively, in the mounting direction $M_1$. As the inner edges 222, 232 approach the inflection area 228, 238, respectively, each of the inner edges 222, 232 extends toward and becomes closer to the longitudinal axis 212. The inner edges 222, 232 directly interface with each other at the second contact zone 216. The second gap 242 is defined longitudinally between the first contact zone 214 and the second contact zone 216 and laterally between the inner edges 222, 232. Thus, the inner edges 222, 232 may initially extend away from each other and away from the longitudinal axis 212 when the inner edges 222, 232 extend from the contact zone 214 in the mounting direction $M_1$ and then curve to extend toward each other and toward the longitudinal axis 212 as the inner edges 222, 232 approach the second contact zone 216.

As shown in FIG. 2, each of the first and second gaps 240, 242 has a respective length $L_{G1}$, $L_{G2}$ that is measured along the longitudinal axis 212. More specifically, the length $L_{G1}$ of the first gap 240 is measured between the base portion 202 to the contact zone 214. The length $L_{G2}$ of the second gap 242 is measured between the first and second contact zones 214, 216. In the illustrated embodiment, the length $L_{G1}$ is shorter than the length $L_{G2}$. Also shown in FIG. 2, the gap 242 may have an elongated diamond shape.

In the illustrated embodiment, the first and second gaps 240, 242 are separated from each other by the contact zone 214 when the first and second legs 220, 230 directly engage each other at the contact zone 214. It is understood, however, that the first and second legs 220, 230 may not directly engage each other at the contact zone 214 or at the contact zone 216. Accordingly, the first and second gaps 240, 242 may be considered part of a larger gap if the first and second legs 220, 230 do not engage each other.

In the illustrated embodiment, the inner edges 222, 232 directly interface with each other from respective contact points 229, 239 at the contact zone 216 to the respective distal ends 208, 210. Thus, the inflection area 228 is defined between the contact point 229 and the distal end 208, and the inflection area 239 is defined between the contact point 239 and the distal end 210. The distal ends 208, 210 form a portion of the corresponding inflection areas 228, 238. In other embodiments, the distal ends 208, 210 may be separated from each other and from the longitudinal axis 212 as the inner edges 222, 232 extend from the second contact zone 216 toward the distal ends 208, 210. For instance, due to manufacturing tolerances, the distal ends 208, 210 may not directly interface with each and a nominal gap may exist between the inner edges 222, 232 from the distal ends 208, 210 to the contact zone 216.

FIGS. 3 and 4 are cross-sections of the first and second legs 220, 230 taken along lines 3-3 and 4-4, respectively, in FIG. 2. FIG. 3 extends through the first and second legs 220, 230 at the inflection areas 226, 236, and FIG. 4 extends through the first and second legs 220, 230 where a maximum separation distance, referenced as $SD_M$, exists between the inner edges 222, 232 within the second gap 242. In some embodiments, the inner edges 222, 232 (FIG. 4) between the base portion 202 (FIG. 2) and the respective inflection areas 226, 236 (shown in FIG. 3) coincide with a contact plane $P_1$ that includes the longitudinal axis 212. Likewise, in some embodiments, the inner edges 222, 232 between the inflection areas 226, 236 and the distal ends 208, 210 (FIG. 2) coincide with the contact plane $P_1$. In more particular embodiments, the entire first and second legs 220, 230 coincide with the contact plane $P_1$.

With respect to FIG. 4, the compliant contact 200 has a maximum width $W_M$ that is measured between the outer edges 224, 234 along the contact plane $P_1$. In an exemplary embodiment, the first and second legs 220, 230 have substantially uniform cross-sectional dimensions such that the maximum width $W_M$ and the maximum separation distance $SD_M$ occur at the cross-section of the compliant contact 200. However, in alternative embodiments, the maximum width $W_M$ may occur at a different cross-section. When the first and second legs are inserted into the corresponding PTH 152 (FIG. 1), the maximum separation distance $SD_M$ will become smaller than the distance shown in FIG. 4.

The first and second legs 220, 230 also have a stock thickness $T_S$, which may be equal to the thickness, in some embodiments, of the sheet material from which the compliant contact 200 (FIG. 1) was stamped. The compliant contacts 200 may have a size ratio between the corresponding maximum separation $SD_M$ and the corresponding stock thickness $T_S$. In some cases, embodiments set forth herein may achieve a size ratio that conventional compliant contacts are not able to achieve. For example, prior to being inserted into the PTH 152, the size ratio ($SD_M:T_S$) may be at most 1.00. In certain embodiments, the size ratio may be at most 0.85 and, in particular embodiments, the size ratio is at most 0.75 prior to being inserted into the PTH 152. More specifically, the size ratio is at most 0.67 prior to being inserted into the PTH 152. After being inserted into the PTH 152, the size ratio may be reduced. For example, the size ratio may be at most 0.65 and, in more particular embodiments, the size ratio may be at most 0.50 when within the PTH 152. In other embodiments, the size ratio after being inserted into the PTH 152 may be at most 1.00, at most 0.85, or at most 0.75. In other embodiments, the compliant contacts 200 have a size ratio that is greater than 1.00.

FIG. 5 is a cross-section of the circuit board 148 illustrating the compliant contact 200 inserted into the PTH 152. The circuit board 148 has a board surface 250 that interfaces with the mounting side 140 (FIG. 1) of the connector body 131 (FIG. 1). The circuit board 148 includes a substrate 252 having a plurality of stacked dielectric, ground, and signal layers (not shown) and a thru-hole 254 extending into the substrate 252 from an opening 256 that is defined along the board surface 250. The thru-hole 254 has an inner surface 258 that is plated with a conductive material 260 thereby forming the PTH 152.

The PTH 152 has an interior surface 262 that defines an interior diameter $D_H$ of the PTH 152. The interior diameter $D_H$ is less than the maximum width $W_M$ (FIG. 4) of the compliant contact 200. When the compliant contact 200 is advanced in the mounting direction $M_1$ into the PTH, the distal ends 208, 210 are initially inserted through the opening 256 of the PTH 152. As the compliant contact 200 continues to advance, the outer edges 224, 234 engage the interior surface 262 of the conductive material 260 such that the first and second legs 220, 230 are deflected radially inward. The inner edges 222, 232 engage or, if already engaged, press against each other at the first and second contact zones 214, 216. The first and second legs 220, 230 may be permanently deformed such that the first and second legs 220, 230 are capable of being inserted into the PTH 152. When the compliant contact 200 is inserted into the PTH 152, the outer edges 224, 234 exert a radially outward force against the interior surface 262 due to radially-inward deflection of the first and second legs 220, 230. As such, the compliant contact 200 may be mechanically and electrically coupled to the PTH 152.

Embodiments set forth herein include compliant contacts that are capable of being inserted into PTHs having different diameters and engaging the interior surfaces of the PTHs such that the compliant contact and the PTH are mechanically and electrically coupled. The different diameters may be intentionally designed or as a result of manufacturing tolerances. The first and second gaps 240, 242 enable the compliant contact 200 to be inserted into PTHs 152 having different diameters. By way of example, the diameter $D_H$ may range between about 0.25 mm to about 0.65 mm. When the diameter $D_H$ is smaller than shown in FIG. 5, the first and second gaps 240, 242 permit the first and second legs 220, 230 to be deflected inwardly.

Depending on the size of the diameter $D_H$ and the dimensions of the compliant contact 200, the outer edges 224, 234 engage the interior surface 262 of the PTH 152 at contact areas 266, 268. The contact areas 266, 268 begin at a depth $D_{Y2}$, which is measured from the opening 256 of the PTH 152.

In some embodiments, the depth $D_{Y2}$ of the contact areas 266, 268 may range from about 0.20 mm to about 0.85 mm from the board surface 250. In more particular embodiments, the depth $D_{Y2}$ of the contact areas 266, 268 may range from about 0.20 mm to about 0.60 mm from the board surface 250. Moreover, the compliant contact 200 has a maximum depth $D_{Y3}$ within the PTH 152 measured from the board surface 250 to the distal ends 208, 210. In some embodiments, the maximum depth $D_{Y3}$ may be at most 1.00 mm. In more particular embodiments, the maximum depth $D_{Y3}$ may be at most 0.85 mm.

A stub portion 270 of the compliant contact 200 may correspond to a portion of the compliant contact 200 that does not directly contact the PTH 152 along the outer edges 224, 234. In the illustrated embodiment, the stub portion 270 corresponds to the segments of the first and second legs 220, 230 immediately after the contact areas 266, 268. More specifically, the stub portion 270 includes the segment of the first leg 220 that extends between the contact area 266 and the distal end 208 and the segment of the second leg 230 that extends between the contact area 268 and the distal end 210. A length $L_S$ of the stub portion 270 may be measured as the difference between the maximum depth $D_{Y3}$ and the depth $D_{Y2}$ of the contact areas 266, 268. In some embodiments, the length $L_S$ may be at most 0.90 mm or, more specifically, at most 0.70 mm. In more particular embodiments, the length $L_S$ may be at most 0.65 mm or, even more particularly, at most 0.50 mm.

Figure 6:
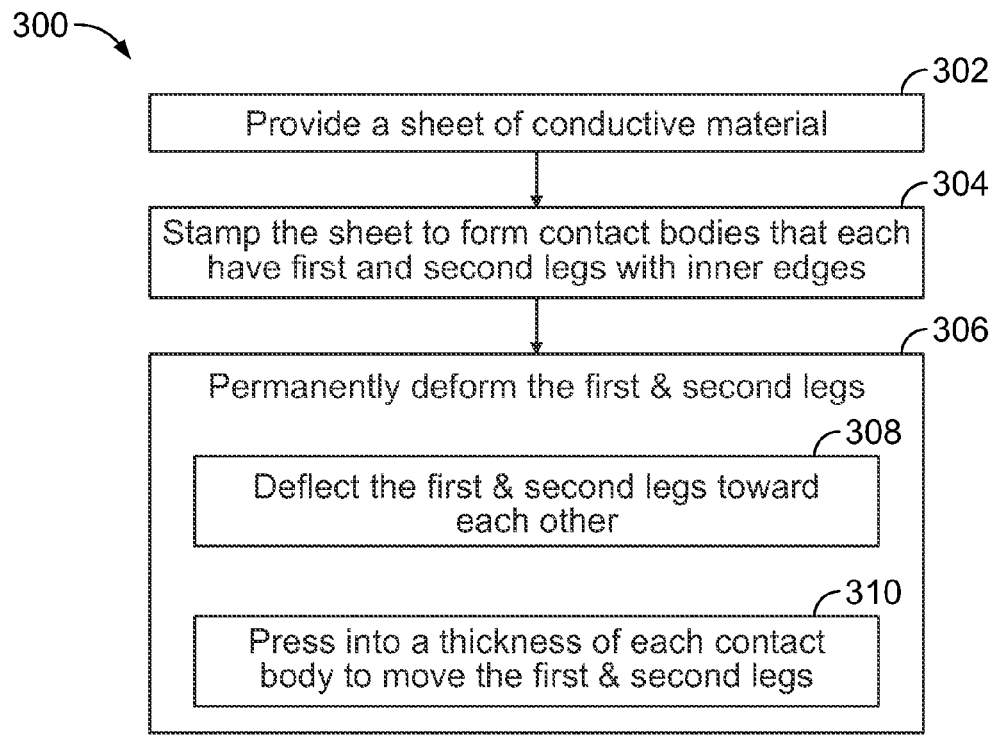
FIG. 6 is a flowchart illustrating a method of manufacturing a compliant contact.
Figure 7:
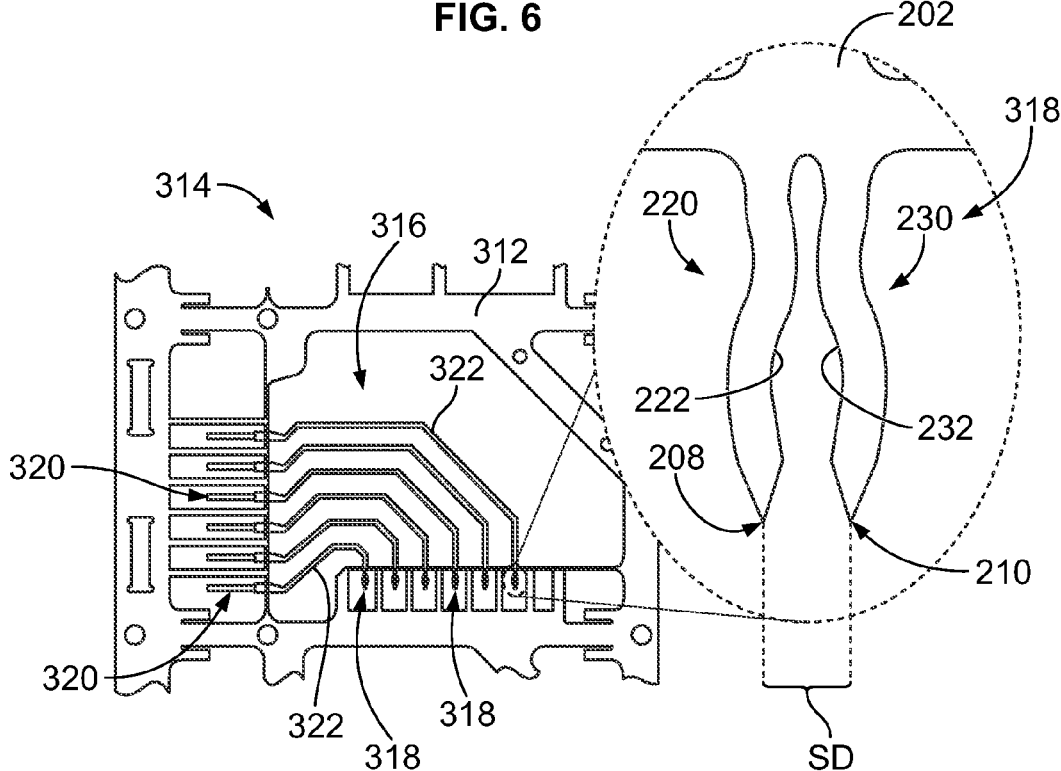
FIG. 7 is a plan view of a leadframe that is stamped from a sheet of conductive material in accordance with an embodiment.
Figure 8:
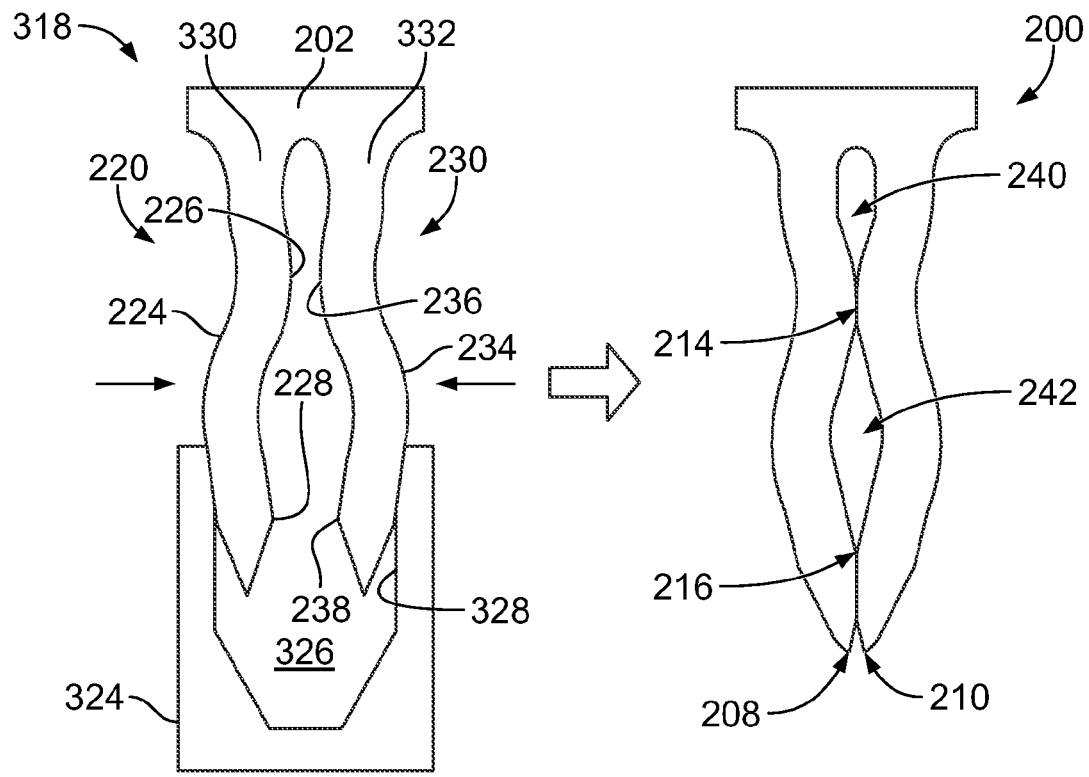
FIG. 8 illustrates a contact body being shaped to form a compliant contact in accordance with an embodiment.
Figure 9:
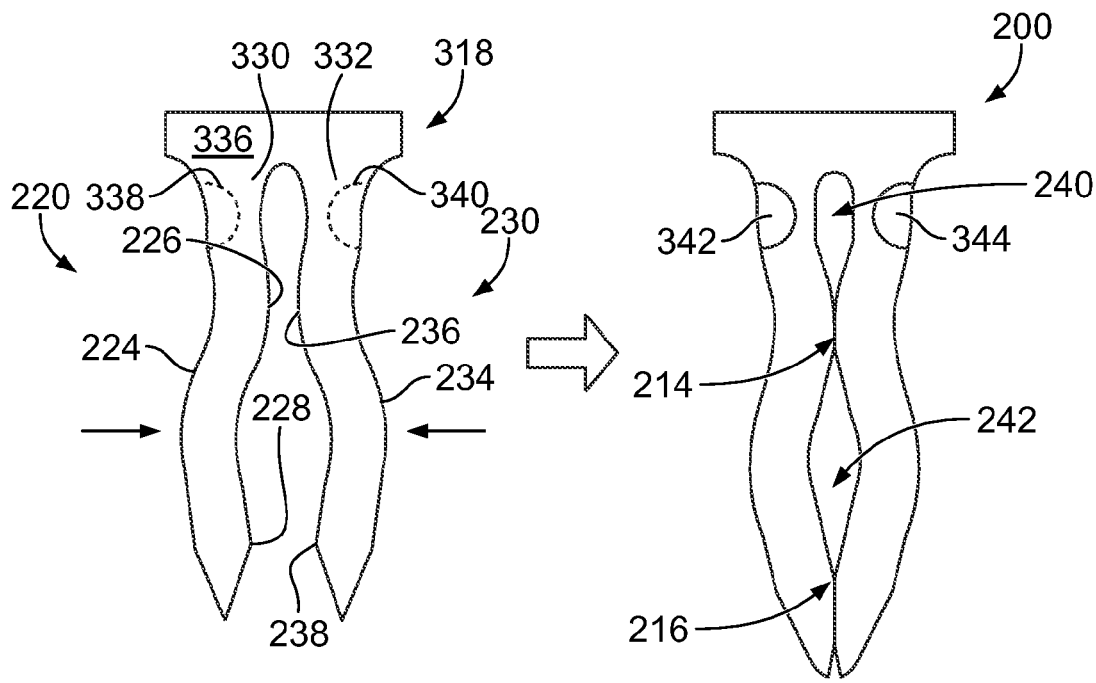
FIG. 9 illustrates a contact body being shaped to form a compliant contact in accordance with an embodiment.

FIG. 6 is a flowchart illustrating a method 300 of manufacturing the compliant contact 200 (shown in FIGS. 8 and 9). The method 300 is described with respect to FIGS. 7-9 and may be used to form the compliant contact 200 and the various features or modifications described herein. In various embodiments, certain steps of the method 300 may be omitted or added, certain steps may be combined, certain steps may be performed simultaneously, certain steps may be performed concurrently, certain steps may be split into multiple sub-steps, certain steps may be performed in a different order, or certain steps or series of steps may be re-performed in an iterative fashion.

With respect to FIGS. 6 and 7, the method 300 includes providing (at 302) a sheet 312 of conductive material. The sheet 312 of the conductive material may be sheet metal. In particular embodiments, the conductive material is capable of transmitting electrical current at a desired electrical performance that is consistent with the electrical performance of high-speed electrical connectors. For example, the sheet metal may include copper, copper alloy, or another metal that is capable of transmitting electrical current.

At 304, the sheet 312 of the conductive material is stamped to provide a plurality of contact bodies 318. For example, the stamping (at 304) may include stamping a leadframe 314 from the sheet 312. As shown, the leadframe 314 has a plurality of signal conductors 316 that include the contact bodies 318. More specifically, each of the signal conductors 316 extends from a corresponding mating end 320, through a conductor segment 322, and to one of the contact bodies 318. In FIG. 7, the leadframe 314 includes six (6) signal conductors 316 that have different lengths.

When the electrical connector 130 (FIG. 1) is fully constructed, the signal conductors 316 may be overmolded to form the contact modules 135 (FIG. 1). In alternative embodiments, the contact bodies 318 are not part of a larger leadframe. Instead, the sheet 312 may be stamped to only form the contact bodies 318 without mating ends or conductor segments. Alternatively or in addition to the stamping at 304, the sheet 312 and the contact bodies 318 may be processed by other means, such as etching and/or coating.

FIG. 7 also shows an enlarged view of one of the contact bodies 318. The contact body 318 has many of the same features of the compliant contact 200 (FIG. 1). For example, the contact body 318 includes the base portion 202 and first and second legs 220, 230 that extend from the base portion 202 to the respective distal ends 208, 210. As shown, the inner edges 222, 232 face each other and are spaced apart by the separation distance SD. The inner edges 222, 232 have non-linear profiles that are caused by the stamping (at 304).

As described above, the sheet 312 and the contact bodies 318 have the stock thickness $T_S$ (FIG. 4) In some embodiments, the dimensions of the contact bodies 318 may be configured to satisfy certain manufacturing standards. The contact body 318 has a size ratio ($SD_M$:$T_S$) in which the maximum separation distance $SD_M$ (FIG. 4) represents a maximum value of the separation distance SD between the inner edges 222, 232. In some embodiments, the size ratio is at least 0.75 or, more specifically, at least 0.85 after the contact bodies 318 are stamped but prior to the inner edges 222, 232 being moved toward each other. In some embodiments, the size ratio is at least 1.00 after the contact bodies 318 are stamped but prior to the inner edges 222, 232 being moved toward each other. More specifically, the separation distance SD in some embodiments may be equal to or greater than the stock thickness $T_S$.

The method 300 also includes permanently deforming (at 306) the first and second legs 220, 230 such that the inner edges 222, 232 move toward each other. FIG. 8 illustrates one such method in which the permanently deforming (at 306) may include deflecting (at 308) the first and second legs 220, 230 toward each other. For example, a die 324 may have a cavity 326 defined by an interior wall 328. The interior wall 328 may have a predetermined shaped in order to deform the contact body 318 into a designated configuration. More specifically, the interior wall 328 may be configured to engage the outer edges 224, 234 so that the first and second legs 220, 230, respectively, are deflected toward each other. The contact body 318 includes joints 330, 332 that join the first and second legs 220, 230 to the base portion 202. When the outer edges 224, 234 are engaged by the die 324, the first and second legs 220, 230 may bend about the joints 330, 332, respectively, such that the first and second legs 220, 230 are permanently deformed and move toward each other. More specifically, the die 324 deflects the first and second legs 220, 230 until the respective inflection areas 226, 236 directly interface with each other at the contact zone 214 thereby forming the first gap 240 and the respective inflection areas 228, 238 directly interface each other at the contact zone 216 thereby forming the second gap 242. The interior wall 328 may also deform the distal ends 208, 210 into a designated shape such that the distal ends 208, 210 directly interface with each other.

The method 300 also includes pressing (at 310) into the stock thickness $T_S$ (FIG. 4) of the contact body 318 such that the first and second legs 220, 230 are permanently deformed and move toward each other. The pressing (at 310) may also be referred to as swaging the contact body 318. With respect to FIG. 9, swaging posts (not shown) may directly engage a side surface 336 of the contact body 318 and press into the side surface 336 to displace the conductive material of the contact body 318 thereby moving the first and second legs 220, 230. In some embodiments, the swaging posts may engage localized regions 338, 340 (indicated by dashed lines) proximate to or at the joints 330, 332, respectively. In some embodiments, the localized regions 338, 340 may include the outer edges 224, 234, respectively. When the swaging posts are punched into the stock thickness $T_S$ along the side surface 336, the conductive material may be displaced thereby forcing the first and second legs 220, 230 toward each other until the inflection areas 226, 236 directly interface each other at the contact zone 214 and the inflection areas 228, 238 directly interface each other at the contact zone 216. The compliant contact 200 may have swage marks 342, 344 caused by the pressing (at 310). The compliant contact 200 may have a reduced thickness at the swage marks that is less than the stock thickness $T_S$. When the inner edges 222, 232 directly interface each other to form the first and second contact zones 214, 216, the first and second gaps 240, 242 are also formed.

FIGS. 10-12 are plan views of compliant contacts 400, 430, and 460, respectively, which may be formed using the method 300 (FIG. 6) or other processes and may have similar features as the compliant contact 200 (FIG. 1). The compliant contacts 400, 430, and 460 are ready for insertion into corresponding PTHs (not shown). With respect to FIG. 10, the compliant contact 400 includes a base portion 402 and first and second legs 404, 406 that are coupled to the base portion 402 and extend from the base portion 402 to respective distal ends 408, 410. The first and second legs 404, 406 are physically discrete elements that are only coupled to each other through the base portion 402. The compliant contact 400 is oriented with respect to a longitudinal axis 412 that extends through a center of the base portion 402 and generally parallel to and between the first and second legs 404, 406. As shown in the plan view of FIG. 10, the first and second legs 404, 406 may be symmetrical with respect to the longitudinal axis 412.

The first leg 404 has an inner edge 414 and an outer edge 416 that face in generally opposite directions. Similarly, the second leg 406 has an inner edge 418 and an outer edge 420 that face in generally opposite directions. As the inner edges 414, 418 extend away from the base portion 402 toward the distal ends 408, 410, respectively, the inner edges 414, 418 extend to respective inflection areas 422, 424. As the inner edges 414, 418 approach the inflection area 422, 424, respectively, the inner edges 414, 418 extend toward each other. The first and second legs 404, 406 directly interface with each other at a contact zone 415. A gap 426 is defined longitudinally between the base portion 402 and the contact zone 415 and laterally between the inner edges 414, 418. The gap 426 decreases as the inner edges 414, 418 approach the inflection areas 422, 424, respectively, or the contact zone 415.

Unlike the compliant contact 200, each of the first and second legs 404, 406 includes only one inflection area such that the compliant contact 400 has only one contact zone. Nonetheless, in some embodiments, the outer edges 416, 420 may exert a suitable force for mechanically and electrically coupling the compliant contact 400 and the PTH (not shown).

With respect to FIG. 11, the compliant contact 430 may have a similar shape as the compliant contact 400 (FIG. 10). The compliant contact 430 has first and second legs 432, 434. The first leg 430 has inner and outer edges 433, 443, and the second leg 434 has inner and outer edges 435, 445. The first leg 432 has a width $W_3$ measured between the inner and outer edges 433, 443, and the second leg 434 has a width $W_4$ measured between the inner and outer edges 435, 445.

Unlike the compliant contact 400, the compliant contact 430 has edge projections 436, 438 along the inner edges 433, 435, respectively. The edge projections 436, 438 project toward the opposing leg. The edge projection 436 defines an inflection area 440 of the inner edge 433, and the edge projection 438 defines an inflection area 442 of the inner edge 435. In the illustrated embodiment, the edge projections 436, 438 are formed by increasing the widths $W_3$, $W_4$, respectively. In particular embodiments, the inflection areas 440, 442 represent where the first and second legs 432, 434, respectively, have maximum values of the corresponding widths $W_3$, $W_4$. When the compliant contact 430 is inserted into a PTH (not shown), the edge projections 436, 438 may engage each other at a contact zone 444. The inner edges 433, 435 may also engage each other at a contact zone 446.

With respect to FIG. 12, the compliant contact 460 may have a similar shape as the compliant contact 400 (FIG. 10) or the compliant contact 430 (FIG. 11). However, as shown, the compliant contact 460 has multiple edge projections 462, 464 along an inner edge 466 and multiple edge projections 472, 474 along an inner edge 476. When the compliant contact 460 is inserted into a PTH (not shown), the edge projections 462, 472 engage each other at a contact zone 480 and the edge projections 464, 474 engage each other at a contact zone 482. The inner edges 466 and 476 may also engage each other at a contact zone 488. Accordingly, the inner edges 466, 476 may engage each other at three separate contact zones.

Also shown in FIG. 12, the compliant contact 400 has outer edges 484, 486. Edge portions 485, 487 of the outer edges 484, 486 extend parallel to each other such that the outer edges 484, 486 along the edge portions 485, 487 have a uniform width $W_5$. The width $W_5$ may be slightly larger than a diameter of the PTH (not shown) that receives the compliant contact 400.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:
1. An electrical connector for mounting to a circuit board having plated thru-holes (PTHs), the electrical connector comprising:
a connector body having a mounting side that is configured to be mounted to the circuit board; and
a plurality of compliant contacts coupled to the mounting side and configured to be inserted into corresponding

PTHs of the circuit board, each of the compliant contacts of said plurality comprising:
  a base portion coupled to the mounting side of the electrical connector; and
  first and second legs extending in a mounting direction from the base portion to respective distal ends, the distal ends being physically discrete, each of the first and second legs including an inner edge and an outer edge, the outer edges configured to engage the corresponding PTH, each of the inner edges extending from the base portion to a corresponding inflection area, wherein a gap exists between the inner edges of the first and second legs of each of the compliant contacts of said plurality;
  wherein each of the compliant contacts of said plurality is configured to be in an operative condition prior to being inserted into the corresponding PTH, the first and second legs being shaped such that the gap, when the corresponding compliant contact is in the operative condition, decreases as the inner edges approach the corresponding inflection areas in the mounting direction, the inflection areas of the inner edges directly interfacing with each other at a contact zone when the corresponding compliant contact is in the operative condition.

2. The electrical connector of claim 1, wherein the inner edges separate from each other as the inner edges extend from the contact zone in the mounting direction.

3. The electrical connector of claim 1, wherein each of the compliant contacts of said plurality has a longitudinal axis that extends through a center of the base portion and generally parallel to and between the first and second legs, the inner edges of the first and second legs, when the corresponding compliant contact is in the operative condition, extending toward the longitudinal axis as the inner edges approach the corresponding inflection areas in the mounting direction.

4. The electrical connector of claim 1, wherein each of the first and second legs has a substantially uniform width between the inner and outer edges from the base portion to the corresponding inflection area, the first and second legs having the substantially uniform width at the inflection area.

5. The electrical connector of claim 1, wherein each of the first and second legs has a maximum width between the inner and outer edges at the corresponding inflection area.

6. The electrical connector of claim 1, wherein each of the compliant contacts of said plurality has a size ratio ($SD_M:T_S$) in which $SD_M$ equals a maximum value of a separation distance between the inner edges across the gap and $T_S$ equals a common thickness of the first and second legs, the size ratio being less than 0.85 when the corresponding compliant contact is in the operative condition.

7. The electrical connector of claim 1, wherein each of the compliant contacts of said plurality has a maximum width that is measured between corresponding contact areas of the outer edges of the first and second legs, the contact areas configured to engage the corresponding PTH, wherein the contact zone is located between the base portion and the contact areas.

8. The electrical connector of claim 1, wherein the base portion and the first and second legs are stamped-and-formed from a sheet of conductive material such that the first and second legs have a thickness of the sheet.

9. The electrical connector of claim 1, wherein each of the first and second legs has a pair of opposite side surfaces that each extend between the inner edge and the outer edge of the corresponding leg, each of the first and second legs having a common thickness measured between the corresponding side surfaces.

10. The electrical connector of claim 1, wherein the inner edges have non-linear profiles.

11. The electrical connector of claim 1, wherein the first and second legs include respective swage marks along the corresponding outer edges.

12. The electrical connector of claim 1, wherein each of the compliant contacts of said plurality includes first and second joints that join the first and second legs, respectively, to the base portion, the first and second legs including respective swage marks along the corresponding outer edges at or proximate to the first and second joints.

13. An electrical connector for mounting to a circuit board having plated thru-holes (PTHs), the electrical connector comprising:
  a connector body having a mounting side that is configured to be mounted to the circuit board; and
  a plurality of compliant contacts coupled to the mounting side and configured to be inserted into corresponding PTHs of the circuit board, each of the compliant contacts comprising:
    a base portion coupled to the mounting side of the electrical connector; and
    first and second legs extending in a mounting direction from the base portion to respective distal ends, the distal ends being physically discrete, each of the first and second legs including an inner edge and an outer edge, the outer edges configured to engage the corresponding PTH, each of the inner edges extending from the base portion to a corresponding inflection area, wherein a gap between the inner edges decreases as the inner edges approach the corresponding inflection areas in the mounting direction, the inflection areas of the inner edges directly interfacing with each other at a contact zone;
  wherein the inflection areas are first inflection areas, the contact zone is a first contact zone, and the gap is a first gap that is between the base portion and the first contact zone, each of the inner edges extending away from the corresponding first inflection area in the mounting direction and forming a second inflection area, wherein the second inflection areas directly interface each other at a second contact zone and the inner edges form a second gap between the first and second contact zones.

14. The electrical connector of claim 13, wherein the base portion and the first and second legs are stamped-and-formed from a sheet of conductive material.

15. A circuit board assembly comprising:
  a circuit board having plated thru-holes (PTHs) defined by respective interior surfaces of the circuit board; and
  an electrical connector having a mounting side that is coupled to the circuit board and a plurality of compliant contacts that project form the mounting side, each of the compliant contacts of said plurality extending into a corresponding PTH in a mounting direction, each of the compliant contacts of said plurality comprising:
    a base portion coupled to the mounting side of the electrical connector; and
    first and second legs that extend in the mounting direction from the base portion to respective distal ends, the distal ends being physically discrete, each of the first and second legs including an inner edge and an outer edge, the outer edges of the first and second legs being engaged to the interior surface of the corresponding PTH at respective contact areas, the inner edges of the first and second legs engaging each other at a contact zone, wherein a gap exists between the inner edges of the first and second legs and between the base portion and the contact zone;

wherein each of the compliant contacts of said plurality has a longitudinal axis that extends through a center of the base portion and generally parallel to and between the first and second legs, the contact areas being at a first depth with respect to the base portion, the contact zone being at a second depth with respect to the base portion, wherein the first and second depths are different and are measured along the longitudinal axis.

16. The circuit board assembly of claim 15, wherein each of the inner edges of the first and second legs has an inflection area, the inflection areas directly engaging each other at the contact zone, each of the inner edges extending from the base portion to the corresponding inflection area, wherein a gap between the first and second legs decreases as the inner edges approach the corresponding inflection areas in the mounting direction.

17. The circuit board assembly of claim 16, wherein the inflection areas are first inflection areas, the contact zone is a first contact zone, and the gap is a first gap that is between the base portion and the first contact zone, each of the inner edges including a second inflection area, wherein the second inflection areas directly interface each other at a second contact zone and the inner edges form a second gap that exists between the first and second contact zones.

18. The circuit board assembly of claim 15, wherein the first depth is about 0.15 mm to about 0.35 mm from a board surface of the circuit board.

19. The circuit board assembly of claim 15, wherein each of the compliant contacts of said plurality has a size ratio ($SD_M{:}T_S$) in which $SD_M$ equals a maximum value of a separation distance between the inner edges across the gap and $T_S$ equals a stock thickness of the compliant contacts, the size ratio being less than 0.67 after the compliant contact is inserted into the corresponding PTH.

20. The circuit board assembly of claim 15, wherein the contact zone is located between the base portion and the contact areas.

* * * * *